US005582520A

United States Patent [19]

Doudon

[11] Patent Number: 5,582,520

[45] Date of Patent: Dec. 10, 1996

[54] ELECTROSTRIP RECEPTACLE

[75] Inventor: Robert Doudon, St. Nicephore, Canada

[73] Assignee: Siemens Electric Limited, Brampton, Canada

[21] Appl. No.: 496,820

[22] Filed: Jun. 29, 1995

[51] Int. Cl.$^6$ .......... H03R 26/00

[52] U.S. Cl. .......... 439/106; 439/122

[58] Field of Search .......... 439/116, 117, 439/122, 121, 106, 650

[56] References Cited

U.S. PATENT DOCUMENTS

| | | | |
|---|---|---|---|
| 2,437,579 | 3/1948 | Wilson | 173/334.1 |
| 2,924,687 | 2/1960 | Platz | 439/116 |
| 2,924,802 | 2/1960 | Platz et al. | 339/21 |
| 2,924,804 | 2/1960 | Frank et al. | 339/21 |
| 2,943,292 | 6/1960 | Herrmann et al. | 439/122 |
| 2,946,037 | 7/1960 | Platz et al. | 339/154 |
| 3,081,442 | 3/1963 | Platz | 339/14 |
| 3,299,391 | 1/1967 | Herrmann et al. | 339/14 |

*Primary Examiner*—Gary F. Paumen
*Attorney, Agent, or Firm*—Ira Lee Zebrak

[57] ABSTRACT

A removable electrical receptacle adapted to be operatively connected to a continuous outlet cable having an insulating housing comprised of a case and a cover and having contacts for three electrical plugs.

19 Claims, 7 Drawing Sheets

ELECTROSTRIP RECEPTACLE

FIELD OF THE INVENTION

The present invention relates generally to electrical receptacles and more particularly to a removable electrical receptacle utilized with a continuous outlet cable.

BACKGROUND

U.S. Pat. No. 2,924,804 entitled Electric Distribution System, illustrates a two wire continuous outlet duct or cable construction in which there is a flat plastic body strip having inwardly turned lips along the longitudinal edges thereof with longitudinally extending conductors imbedded beneath the lips. The lips are closely spaced from the body of the strip so as to provide a pair of continuous longitudinally extending openings through which power may be tapped from the conductors at any point along the length of the strip. The strip is also provided with an integrally formed longitudinally extending projection or polarizing rib disposed in an off center position between the lips. A third or grounding conductor wire can be provided which is conveniently imbedded in the main body of the strip and positioned adjacent to the polarizing rib with the surface of the grounding conductor being exposed. Such a construction is illustrated in abandoned U.S. patent application Ser. No. 754/079, filed Aug. 8, 1958, in the name of J. B. Cataldo et al., entitled Three Wire Electric Distribution System and assigned to the assignee of the instant invention.

Prior art constructions have been less than satisfactory in that they are more complex in their construction and concomitantly more expensive and less reliable in operation.

Such receptacles include a molded insulating housing comprising a cover and a hollow case which is adapted to be mounted to a three wire continuous outlet cable of the type illustrated in the aforemention abandoned U.S. patent application (Ser. No. 754,097).

OBJECTS OF THE INVENTION

It is a general object of the invention to provide a detachable lever type receptacle utilizing a continuous outlet cable system which is less expensive and more reliable in operation than prior art receptacles and utilizing a one-piece grounding contact means, a one piece line contact means, a one piece neutral contact means, and capable of accommodating three sets of blade contacts for three devices.

It is a further object of the present invention to provide a receptacle having a case and cover which reduces the possible bending of the side walls of the case resulting from the possible application of excessive force on closing the cover or when an electrical plug is inserted in the cover.

It is a further object of the present invention to provide a receptacle with a latching mechanism to secure the cover to the case and reduce the possibility that pulling or jerking of a plug cap connected to the top face of the cover could cause the cover to move to an open position and cause disengagement of the wire contacts from the continuous outlet cable and thereby causing the receptacle to be pulled loose from the continuous outlet cable.

SUMMARY OF THE INVENTION

In accordance with one aspect of the invention, a removable electrical receptacle is provided to be operatively connected to a continuous outlet cable having a neutral wire, a line wire and a ground wire, the receptacle including: an insulating housing comprised of a case and a cover; the case further including at least one wall being adapted to having guides extending therethrough for receiving the blades of a plurality of attachment plug caps; a neutral contact means having a first and a second neutral camming portion each with a neutral cable engaging portion; each of the neutral cable engaging portions engageable with the neutral wire of the continuous outlet cable; the first and second neutral camming portions being biased in a retracted position wherein the receptacle is mountable to and dismountable from the continuous outlet cable; the neutral contact means further having a first and a second and a third neutral blade receiving contact; a line contact means having a first and a second line camming portion each having a line cable engaging portion; each of the line cable engaging portions engageable with the line wire of the continuous outlet cable; the first and second line camming portions being biased in a retracted position wherein the receptacle is mountable and dismountable from the continuous outlet cable; the line contact means further having a first and a second and a third line blade receiving contact; a ground contact means having a rib with a ground cable engaging portion engageable with the ground wire of the continuous outlet cable, the rib being biased in a retracted position wherein the receptacle is mountable to and dismountable from the continuous outlet cable; the ground contact means further having a ground prong receiving contact; the cover being moveable between a first and a second position relative to the case, the neutral camming portions and the line camming portions and the rib being in retracted position when the cover is in the first position, the cover having pushing means which when the cover is moved from the first to the second position pushes the line camming portions and the neutral camming portions and the rib to extended positions wherein the line cable engaging portions and the neutral cable engaging portions and the ground cable engaging portion are engageable with the line wire and the neutral wire and the ground wire of the continuous outlet cable; the cover further including pivot means comprising a fixed pivot and a mobile pivot mounting the cover at one end thereof to the case for movement between the first and the second positions; the cover when in the first position having its other end more remote from the case than when the cover is in the second position, the cover being adapted to have blade guides and a ground prong receiving aperture extending therethrough for receiving the blades and a ground prong of a grounded attachment plug cap; the blade guides and the ground prong receiving aperture being aligned with the neutral contact means and the line contact means and the ground contact means when the cover is in the second position.

DETAILED DESCRIPTION

Figure 1:
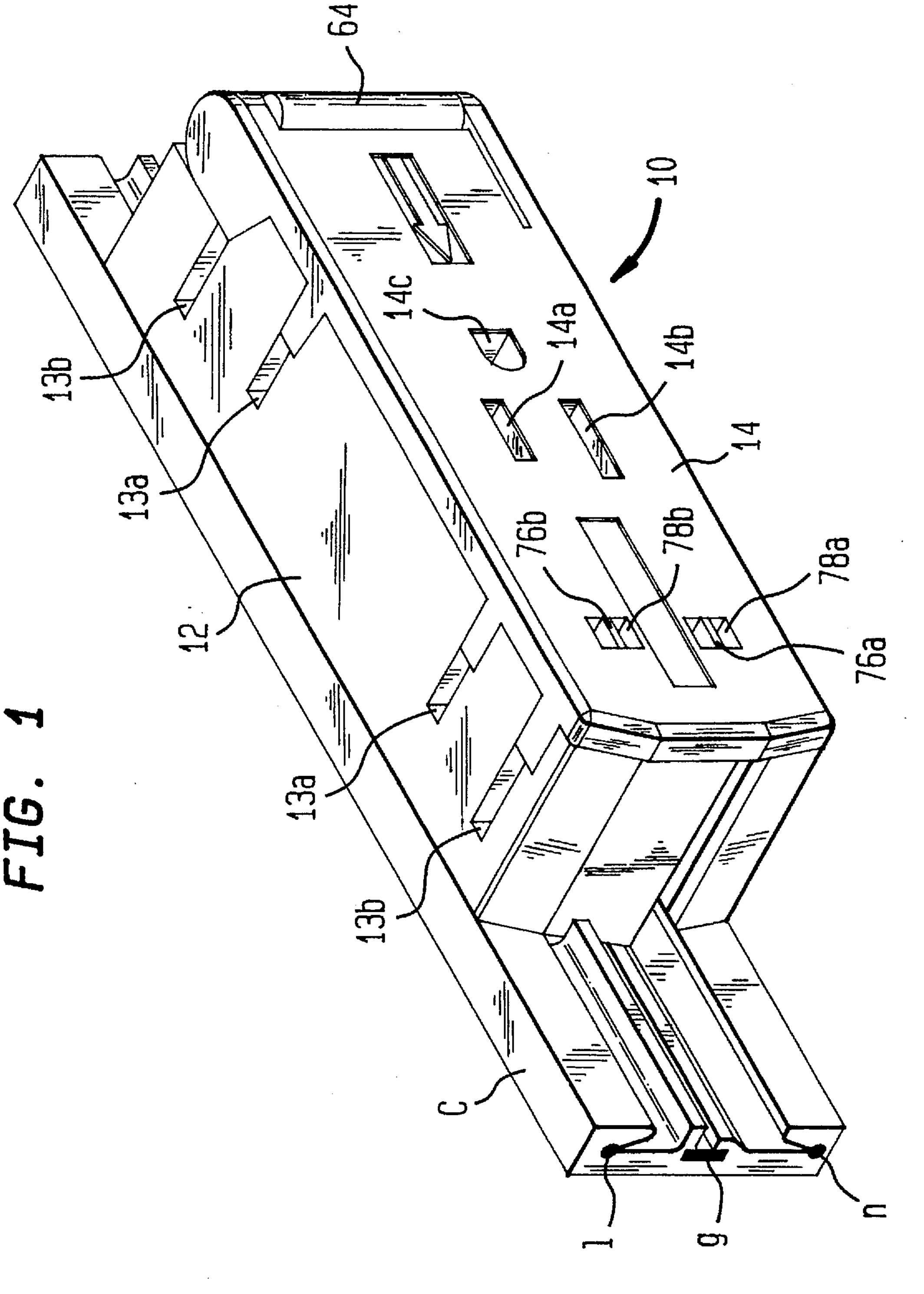
FIG. 1 is a perspective illustrating an electrical receptacle in accordance with present invention mounted to a three wire continuous outlet cable and shown in a closed position.

Referring to FIG. 1, the receptacle 10 of the present invention is of the lever type receptacle described and illustrated in U.S. Pat. No. 3,299,391 which is incorporated by reference and shown mounted to a three wire continuous outlet cable C having a line wire 1, a ground wire g, and a neutral wire n extending along its length and shown and described in the aforementioned abandoned U.S. patent application Ser. No. 754,079.

Figure 2:
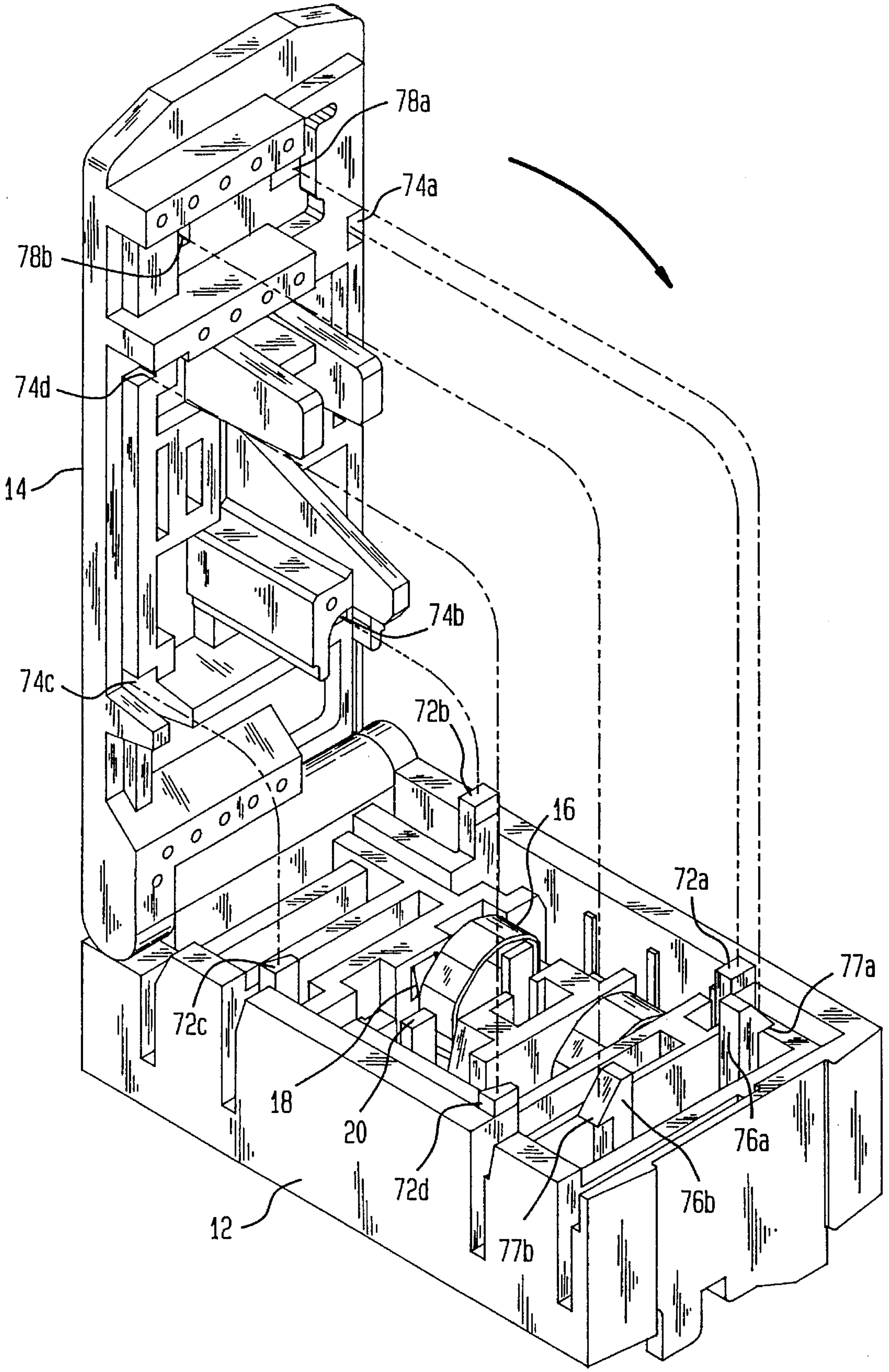
FIG. 2 is a perspective illustrating the receptacle shown in FIG. 1 in an open position.
Figure 3:
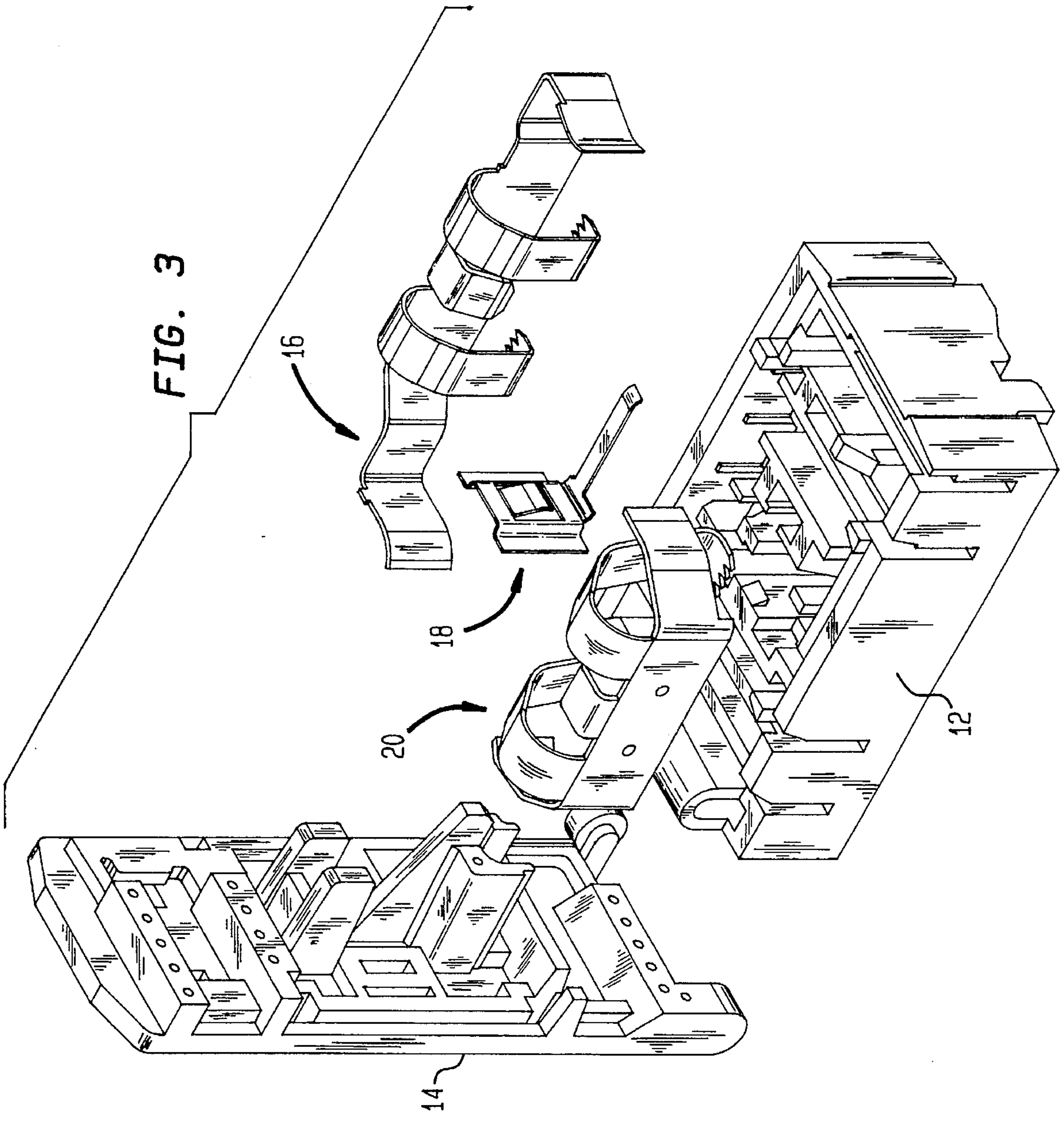
FIG. 3 is an exploded perspective view of the receptacle shown in FIGS. 1–2 showing the case, cover, and the line, neutral and ground contact means.
Figure 4A:
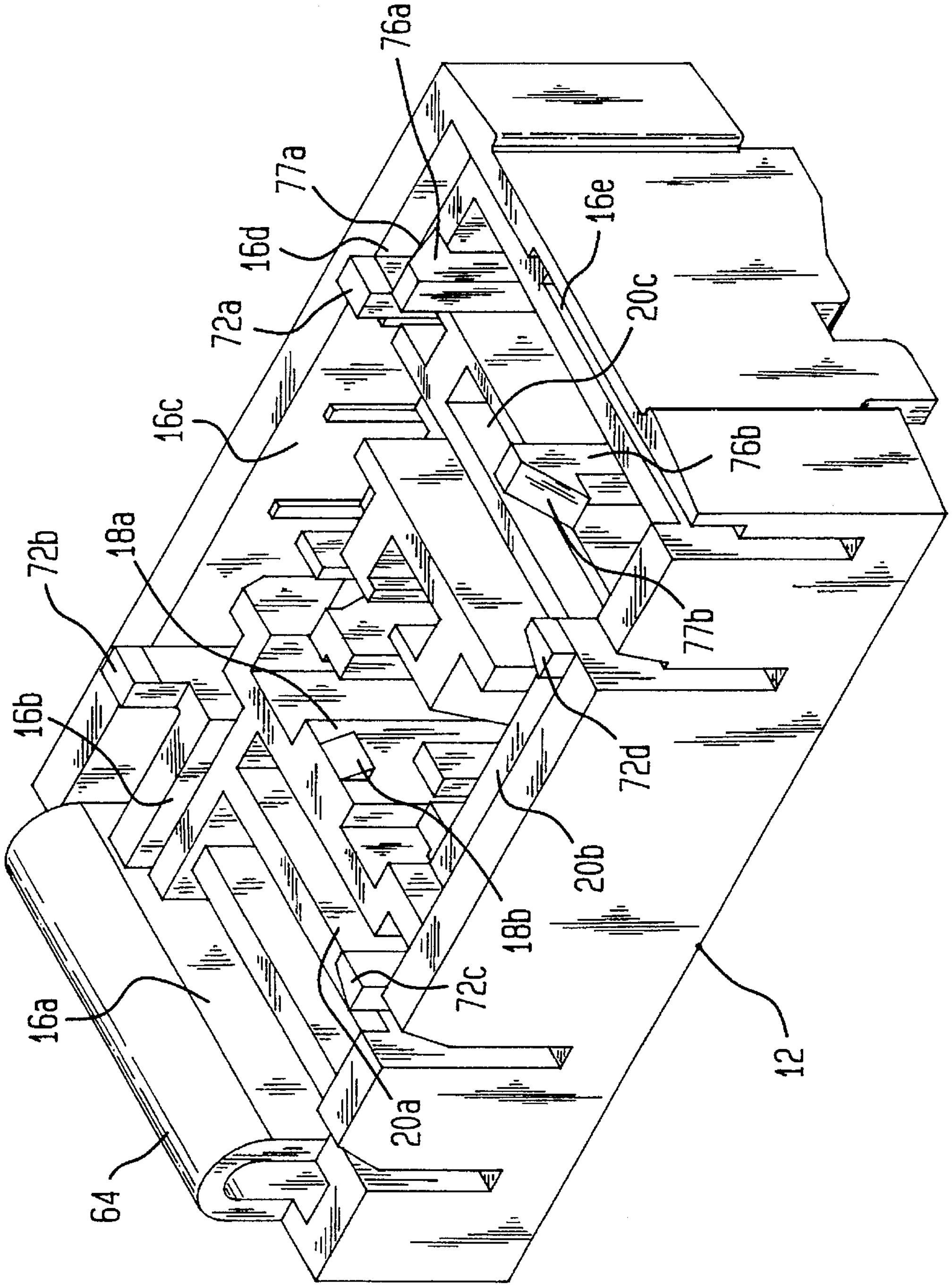
FIG. 4A is an enlarged perspective view of the case of the receptacle shown in FIGS. 1–3 with the line, neutral and ground contact means removed.
Figure 5:
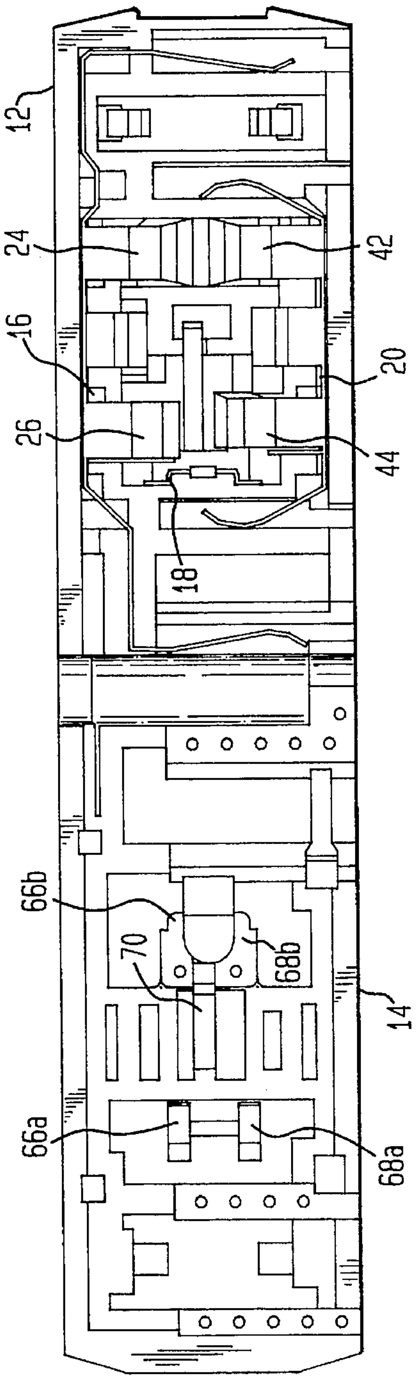
FIG. 5 is a plan view of the receptacle shown in FIGS. 1 and 2.

Referring to FIG. 1, receptacle 10 is comprised of a molded insulated housing comprising a hollow case 12 and a cover 14 which is shown in the closed position. Mounted within case 12 are a neutral contact means 16, a ground contact means 18, and a line contact means 20 (FIGS. 2 and 3). Neutral contact means 16, line contact means 20 and ground contact means 18 are constructed of sheet spring material which is a good electrical conductor. Neutral contact means 16 and line contact means 20 are located and maintained in case 12 by being snap fitted into correspondingly shaped recesses 16*a*, 16*b*, 16*c*, 16*d*, 16*e* and 20*a*, 20*b*, 20*c* (FIGS. 4A, 5). Ground contact means 18 is located and maintained in position in case 12 by being snap fitted into a corresponding recess 18*a* and blocking formation (or ground stopper) 18*b*.

Figure 7:
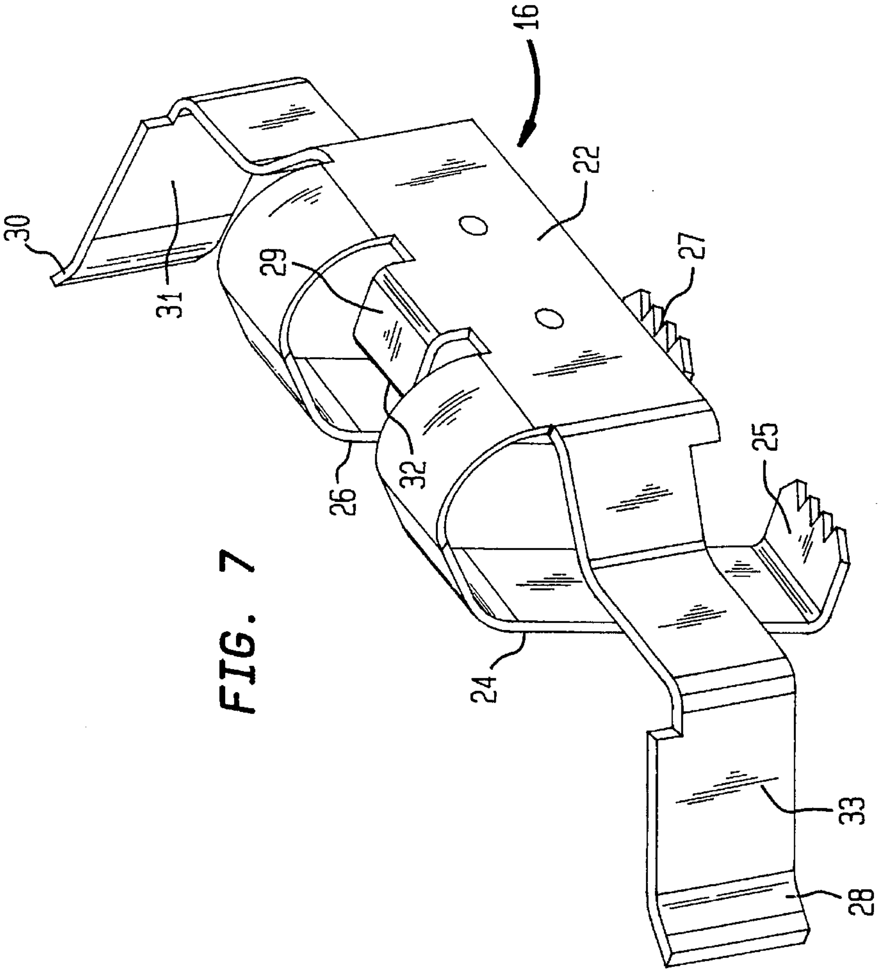
FIG. 7 is a perspective view of the neutral contact means.

Referring to FIG. 3 and more particularly FIG. 7, neutral contact means 16 is a one piece construction and includes a U-shaped mounting part 22 having two arms each of which has a neutral camming portion 24, 26 and a neutral cable engaging portion 25, 27. The free edge of neutral cable engaging portion 25, 27 is serrated in order to facilitate making good electrical contact with neutral wire n of continuous outlet cable C. Extending from U-shaped mounting part 22 are legs 28, 29, 30 each of which has a neutral blade receiving contact 31, 33 for making electrical contact with plug blades. Web portion of U-shaped mounting part 22 is similarly provided with a neutral blade receiving contact 32 for making electrical contact with plug blades. The one piece neutral contact means 16 has three neutral blade receiving contacts (31, 32, 33).

Figure 8:
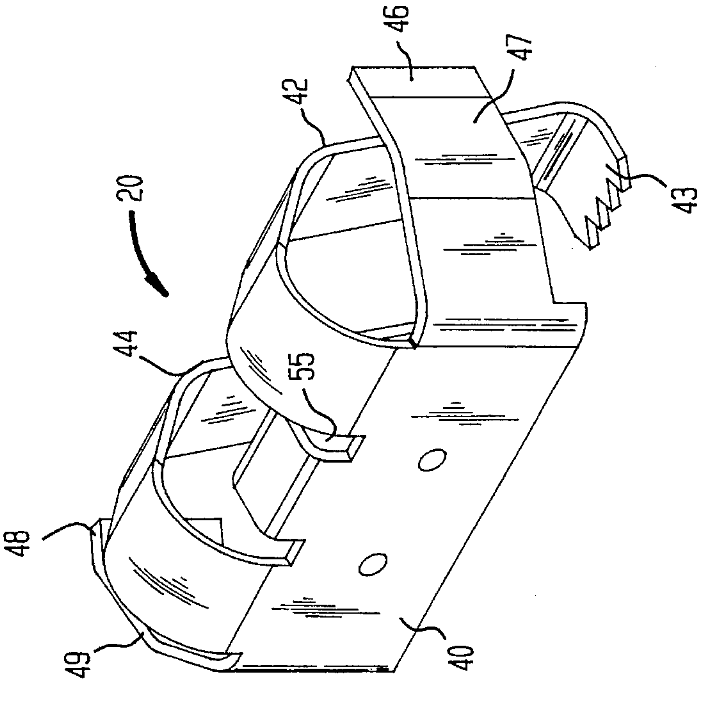
FIG. 8 is a perspective view of the line contact means.

Line contact means 20 is similar in construction and shape to neutral contact means 16. Referring to FIG. 8, line contact means 20 is a one piece construction and includes a U-shaped mounting part 40 having two arms each of which has a line camming portion 42, 44 as well as a line cable engaging portion 43, 45. The free edge of line cable engaging portion 43, 45 is serrated in order to facilitate making good electrical contact with line wire 1 of continuous outlet cable C. Extending from each side of U-shaped mounting part 40 is a leg 41, 46, 48 which has a line blade receiving contact 47, 49. Web portion of U-shaped mounting part 40 is similarly provided with line blade receiving contact 55. The one piece line contact means 20 has three blade receiving contacts 47, 49 and 55 to engage plug blades of three plugs.

Figure 6:
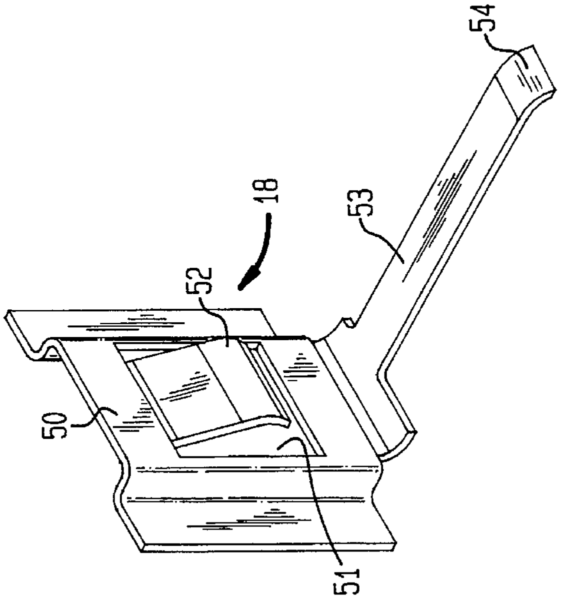
FIG. 6 is a perspective view of the ground contact means.

Referring to FIG. 6, ground contact means 18 is a one piece construction and includes a mounting part 50 which is adapted to have an aperture 51 into which extends a ground prong receiving contact 52. Extending from one end of mounting part 50 is a rib 53 which terminates at an ground cable engaging portion 54. Since ground contact means 18 as well as line and neutral contact means are each a one piece construction, the reliability and safety of receptacle 10 is increased due to the reduction in the possibility of failure, misalignment or malfunction in making and maintaining electrical contact.

Case 12 is provided with two sets of blade guides 13*a*, 13*b* for the blades of two plugs (not shown). Cover 14 has one set of blade guides 14*a*, 14*b*, for the blades of a third plug (not shown). A ground prong receiving aperture 14*c* in cover 14 is provided for the receipt of a ground prong of a ground plug. Ground prong receiving aperture 14*c* is positioned in alignment with ground prong receiving contact 52 of ground contact means 18 so as to be engagable by the ground prong of the ground plug at the same time that the blades of the grounded plug engage the line blade receiving contact 55 of line contact means and the neutral blade receiving contact 32 of neutral contact means 16. Thus, receptacle 10 has provision for three outlets and includes three pair of guides to receive three plugs as shown in FIG. 1. Blade guides 13*a*, 13*b* and 14*a*, 14*b* are positioned in alignment with recesses 16*a*, 16*b*, 16*c*, 16*d*, 16*e* and 20*a*, 20*b* 20*c* so that neutral contact means and line contact means will each be engaged by the blades of a plug when it is mounted to receptacle 10.

Figure 4B:
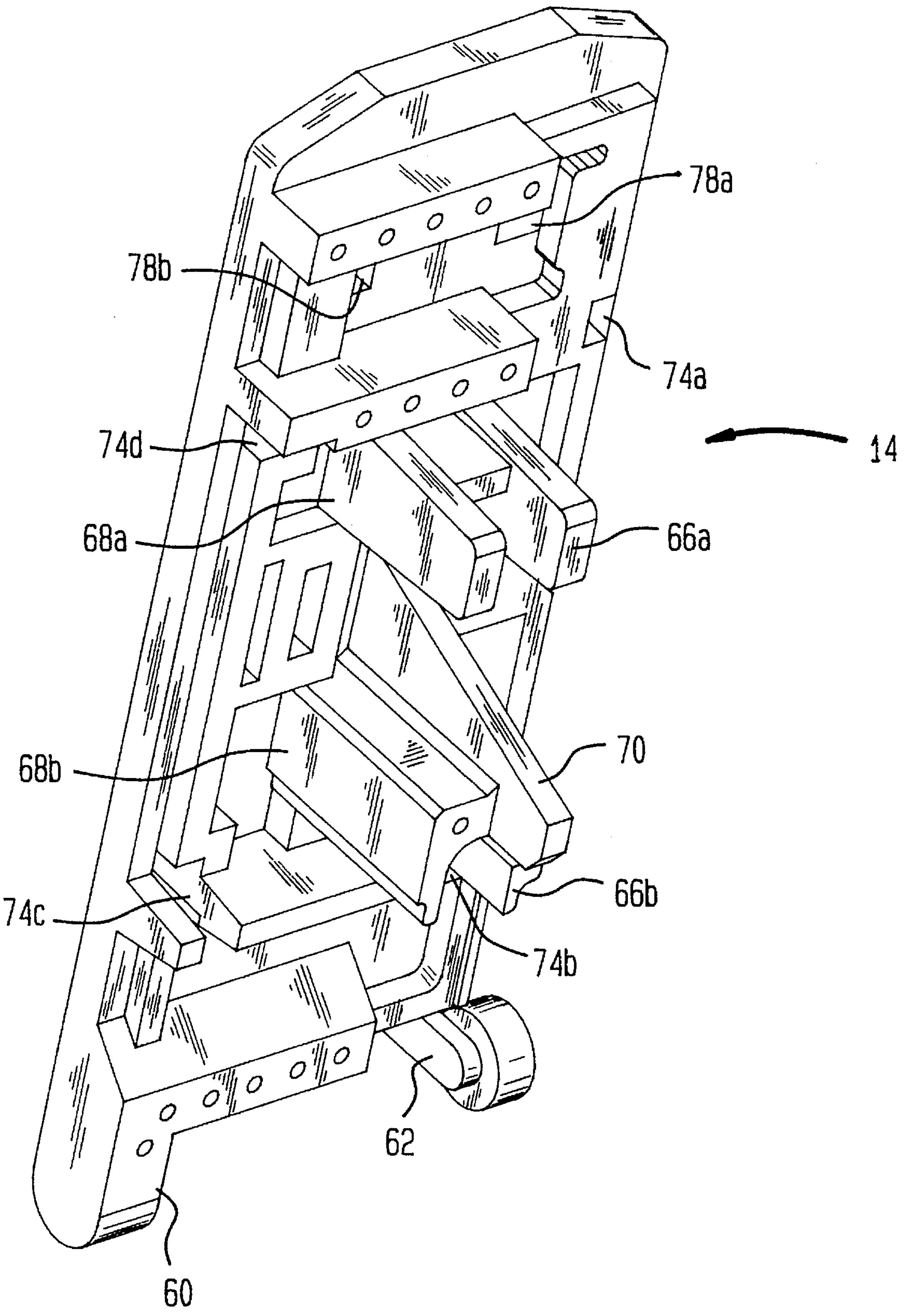
FIG. 4B is an enlarged perspective view showing the underside of the cover.

Referring to FIGS. 3 and 4B, cover 14 is adapted to have at one end a fixed pivot 60 and a mobile pivot 62 for positioning and engaging cover 14 to case 12. Case 12 is adapted to have at a corresponding end a pivot hinge 64 to receive the fixed pivot 60 and mobile pivot 62. Cover 14 is connected to case 12 by placing fixed pivot 60 into one end of pivot hinge 64 and then snapping and rotating mobile pivot 62 into the opposite end of pivot hinged 64. The formation of fixed pivot 60 and mobile pivot 62 as part of molded cover 14 and molded pivot hinge 64 of case 12 eliminates the need to drill holes in the case and installing a pin upon which the cover would rotate. The installation of the cover to the case is therefore accomplished without tooling.

The underside of cover 14 is provided with neutral, line, and ground contact pushers which project from cover 14 for causing the neutral, line and ground contact means to engage the neutral wire, line wire and ground wire respectively of the continuous outlet cable.

Neutral contact pushers 66*a*, 66*b*, line contact pushers 68*a*, 68*b*, and ground contact pusher 70 are positioned on the underside of cover 14 so that when cover 14 is rotated into a closed position with respect to case 12, they are caused to engage respectively, neutral camming portions 24, 26 of neutral contact means 16, line camming portions 42, 44 of line contact means 20, and rib 53 of ground contact means 18, causing neutral cable engaging portions 25 and 27, line cable engaging portions 43, 45 and ground cable engaging portion 54 to move into engagement and make electrical contact with neutral wire n, line wire 1, ground wire g of continuous outlet cable C.

The movement of the free edges of neutral cable engaging portions 25 and 27 and line cable engaging portions 43 and 45 which are serrated scrapes through any foreign matter or dirt accumulations to assure good electrical contact with continuous outlet cable C.

To secure receptacle 10 to continuous outlet cable C, cover 14 is moved to the open position shown in FIG. 2 and then rotated around pivot hinge 64 to a closed position causing neutral, line and ground contact means (16, 20, 18) to respectively engage the neutral wire, line wire and ground wire of the continuous outlet cable.

Refer to FIG. 4A, case 12 is provided with four stoppers 72*a*, 72*b*, 72*c*, 72*d* which are integral to molded case 12 and which project from and extend upward from molded case 12. Alternatively, instead of forming the stoppers as integral parts of case 12, the stoppers can be separate components. Indentations 74*a*, 74*b*, 74*c*, 74*d* having matching configurations to the tops of stoppers 72*a, b, c, d* are formed on the underside of cover 14 and are so positioned to align with each of the stoppers when cover is rotated into its closed position as shown in FIG. 2. When cover 14 is closed, indentations 74*a, b, c, d* receive stoppers 72*a, b, c, d* and reduce bending or deforming of the side walls of case 12 due to the possible application of excessive force on closing the cover or when an electrical plug is inserted into the outlet in cover 14.

Receptacle 10 is also provided with a latching mechanism comprising two latch hooks 76*a*, 76*b* which extend upward toward the top of case 12 and snap fit into latch openings 78*a*, 78*b* formed in cover 14 when cover 14 is closed onto case 12. Alternatively, instead of forming the latch hooks as integral parts of case 12, they can be separate components. When cover 14 is closed onto case 12, latch hooks 76*a*, 76*b* pass through latch openings 78*a*, 78*b* and lips 77*a*, 77*b* snap onto the edge of openings 78*a*, 78*b* thereby securing cover 14 to case 12. To open receptacle 10, latch hooks 76*a*, 76*b* are pressed laterally inward to clear the hook lips from the edge of the latch openings, and cover 14 can then be rotated into an open position. The latching mechanism secures the cover to the case and reduces the possibility that pulling or jerking of a plug gap connected at the top face of the cover could cause the cover to move to an open position and cause disengagement of the wire contacts from the continuous outlet cable and thereby causing the receptacle to be pulled loose from the continuous outlet cable.

When cover 14 is moved to the open position of FIG. 2, neutral contact pushers 66*a*, 66*b*, line contact pushers 68*a*, 68*b*, and ground contact pusher 70 disengage from neutral contact means, line contact means and ground contact means. Neutral cable engaging portions 25, 27, line cable engaging portions 43, 45 and ground cable engaging portion 54 which are made of spring material are self biased to a disengaged position so as to permit dismounting of receptacle 10 from continuous outlet cable C.

The present invention provides a detachable lever type receptacle capable of accommodating three devices and which is less expensive and more reliable in operation and utilizes a one-piece ground contact means, a one-piece line contact means and a one-piece neutral contact means. The receptacle includes stoppers which reduce bending or deforming of the side walls of the case due to the possible application of excessive force on closing of the cover which increases safety and reliability. The use of a latching mechanism to secure the cover to the case furthermore reduces the possibility that pulling or jerking of a plug cap connected to the top face of the cover could cause the cover to move to an open position and cause disengagement of the wire contacts from the continuous outlet cable and thereby causing the receptacle to be pulled loose from the continuous outlet cable.

While the foregoing description and drawings represent the preferred embodiments of the present invention, it will be apparent to those skilled in the art that various changes and modifications may be made therein without departing from the true spirit and scope of the present invention.

I claim:

1. A removable electrical receptacle adapted to be operatively connected to a continuous outlet cable having a neutral wire, a line wire and a ground wire, said receptacle including:

(a) an insulating housing comprised of a case and a cover; the case further including at least one wall having guides extending therethrough for receiving the blades of a plurality of attachment plugs;

(b) a neutral contact means having a first and a second neutral camming portion each with a neutral cable engaging portion; each of said neutral cable engaging portions engageable with the neutral wire of the continuous outlet cable; said first and second neutral camming portions being biased in a retracted position wherein the receptacle is mountable to and dismountable from the continuous outlet cable; the neutral contact means further having a first and a second and a third neutral blade receiving contact;

(c) a line contact means having a first and a second line camming portion each having a line cable engaging portion; each of said line cable engaging portions engageable with the line wire of the continuous outlet cable; said first and second line camming portions being biased in a retracted position wherein the receptacle is mountable and dismountable from the continuous outlet cable; the line contact means further having a first and a second and a third line blade receiving contact;

(d) a ground contact means having a rib with a ground cable engaging portion engageable with the ground wire of the continuous outlet cable, the rib being biased in a retracted position wherein the receptacle is mountable to and dismountable from the continuous outlet cable; the ground contact means further having a ground prong receiving contact;

(e) the cover being moveable between a first and a second position relative to said case, the neutral camming portions and the line camming portions and the rib being in retracted position when said cover is in said first position, the cover having pushing means which when said cover is moved from said first to said second position pushes said line camming portions and said neutral camming portions and said rib to extended positions wherein said line cable engaging portions and said neutral cable engaging portions and said ground cable engaging portion are engageable with the line wire and the neutral wire and the ground wire, respectively of the continuous outlet cable; the cover further including pivot means comprising a fixed pivot and a mobile pivot mounting the cover at one end thereof to the case for movement between said first and said second positions; the cover when in said first position having its other end more remote from the case than when said cover is in said second position, the cover having blade guides and a ground prong receiving aperture extending therethrough for receiving the blades and a ground prong of a grounded attachment plug; the blade guides and the ground prong receiving aperture being aligned with said neutral contact means and said line contact means and said ground contact means when said cover is in said second position.

2. The electrical receptacle of claim 1 wherein the neutral contact means is a one-piece construction.

3. The electrical receptacle of claim 1 wherein the line contact means is a one-piece construction.

4. The electrical receptacle of claim 1 wherein the ground contact means is a one-piece construction.

5. The electrical receptacle of claim 2 wherein the line contact means is a one-piece construction.

6. The electrical receptacle of claim 3 wherein the ground contact means is a one-piece construction.

7. The electrical receptacle of claim 4 wherein the neutral contact means is a one-piece construction.

8. The electrical receptacle of claim 1 wherein the neutral contact means is a one-piece construction and the line contact means is a one-piece construction and the ground contact means is a one-piece construction.

9. The receptacle as in claim 1 wherein the pushing means projects from an underside of the cover.

10. The receptacle as in claim 9 wherein the pushing means includes two neutral contact pushers.

11. The receptacle as in claim 10 wherein the pushing means further includes two line contact pushers.

12. The receptacle as in claim 11 wherein the pushing means further includes a ground contact pusher.

13. The receptacle as in claim 8 wherein the pushing means projects from an underside of the cover.

14. The receptacle as in claim 13 wherein the pushing means includes two neutral contact pushers.

15. The receptacle as in claim 14 wherein the pushing means further includes two line contact pushers.

16. The receptacle as in claim 15 wherein the pushing means further includes a ground contact pusher.

17. The electrical receptacle as in claim 16 further including a latching mechanism comprising a latch hook which extends upward from the interior of the case, and a latch opening formed in the cover wherein the latch hook snap fits into the latch opening when the cover is in the second position to secure the cover to the case.

18. The electrical receptacle as in claim 8 further including a latching mechanism comprising a latch hook which extends upward from the interior of the case, and a latch opening formed in the cover wherein the latch hook snap fits into the latch opening when the cover is in the second position to secure the cover to the case.

19. The receptacle as in claim 18 wherein the case further includes a plurality of stoppers which project and extend upward from the interior of the case, and wherein the cover is adapted to have on an underside thereof indentations positioned to align with corresponding ones of the plurality stoppers when the cover is in the second position.

* * * * *